(12) United States Patent
Sundarrajan et al.

(10) Patent No.: US 6,375,743 B2
(45) Date of Patent: Apr. 23, 2002

(54) METHOD FOR IMPROVED CHAMBER BAKE-OUT AND COOL-DOWN

(75) Inventors: Arvind Sundarrajan, Santa Clara; Dinesh Saigal, San Jose; Peijun Ding, San Jose, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/725,595

(22) Filed: Nov. 29, 2000

Related U.S. Application Data (62) Division of application No. 09/261,700, filed on Mar. 3, 1999, now Pat. No. 6,193,811.

(51) Int. Cl.[7] ............ C23C 16/00; H05H 1/00; B08B 5/02
(52) U.S. Cl. .......... 118/697; 118/695; 118/715; 118/724; 118/69; 156/345; 134/22.18; 134/19
(58) Field of Search ............... 118/697, 695, 118/715, 69, 724, 725, 728, 620, 641; 156/345; 134/22.18, 19, 21

(56) References Cited

U.S. PATENT DOCUMENTS

| | | |
|---|---|---|
| 4,873,833 A | 10/1989 | Pfeiffer et al. |
| 5,433,639 A | 7/1995 | Zahuta et al. |
| 5,536,330 A | 7/1996 | Chen et al. |
| 5,676,751 A | 10/1997 | Banan et al. |
| 5,678,759 A | 10/1997 | Grenci et al. |
| 5,879,467 A | 3/1999 | Zhou et al. |

FOREIGN PATENT DOCUMENTS

| | | | | |
|---|---|---|---|---|
| JP | 63-292100 A | * | 11/1998 | ............ G21K/5/02 |
| JP | 11-200031 A | * | 7/1999 | ............ C23C/14/34 |

* cited by examiner

*Primary Examiner*—Gregory Mills
*Assistant Examiner*—P. Hassanzadeh
(74) *Attorney, Agent, or Firm*—Dugan & Dugan (57) ABSTRACT

A method and apparatus for baking-out and for cooling a vacuum chamber are provided. In a first aspect, an inert gas which conducts heat from the vacuum chamber's bake-out lamps to the shield and from the shield to the other parts within the vacuum chamber is introduced to the chamber during chamber bake-out. The inert gas preferably comprises argon, helium or nitrogen and preferably raises the chamber pressure to about 500 Torr during chamber bake-out. A semiconductor processing apparatus also is provided having a controller programmed to perform the inventive bake-out method. In a second aspect, a process chamber is provided having at least one source of a cooling gas. The cooling gas is input to the chamber and is allowed to thermally communicate with the chamber body and components. The cooling gas may reside in the chamber for a period of time or may be continuously flowed through the chamber. Once the chamber reaches a target temperature the cooling gas is evacuated.

6 Claims, 8 Drawing Sheets

METHOD FOR IMPROVED CHAMBER BAKE-OUT AND COOL-DOWN

This application is a divisional of U.S. patent application Ser. No. 09/261,700, filed Mar. 3, 1999, now U.S. Pat. No. 6,193,811, which is incorporated herein in its entirety by reference.

FIELD OF THE INVENTION

The present invention relates to semiconductor vacuum chambers, and mores specifically to an improved method and apparatus for baking-out and cooling-down a semiconductor vacuum chamber.

BACKGROUND OF THE INVENTION

Many semiconductor device fabrication processes such as physical vapor deposition (PVD), high density plasma (HDP) deposition, etc., employ high vacuum chambers (e.g., $10^{-8}$–$10^{-9}$ Torr) to affect the deposition of thin films on a semiconductor wafer. To reach such high vacuum levels after a vacuum chamber has been vented to atmosphere (e.g., for maintenance, cleaning, etc.) and to prevent film contamination due to the desorption of moisture and other gaseous elements and compounds (i.e., potential contaminants) from the chamber's interior surfaces (e.g., the chamber's shield, wafer pedestal, etc.) during elevated temperature processing, the vacuum chamber's interior surfaces must be heated to an elevated temperature (e.g., about 200° C.) for a time period sufficient to desorb the potential contaminants (i.e., chamber bake-out). Improper chamber bake-out manifests itself in a degraded pre-process or "idle" chamber pressure (i.e., base pressure), an enhanced rate of pressure rise from the base pressure when the chamber's vacuum pump is shut-off (i.e., rate of rise or "ROR"), and poor deposited film quality (e.g., poor film resistivity), as described below with reference to FIG. 1.

Figure 1:
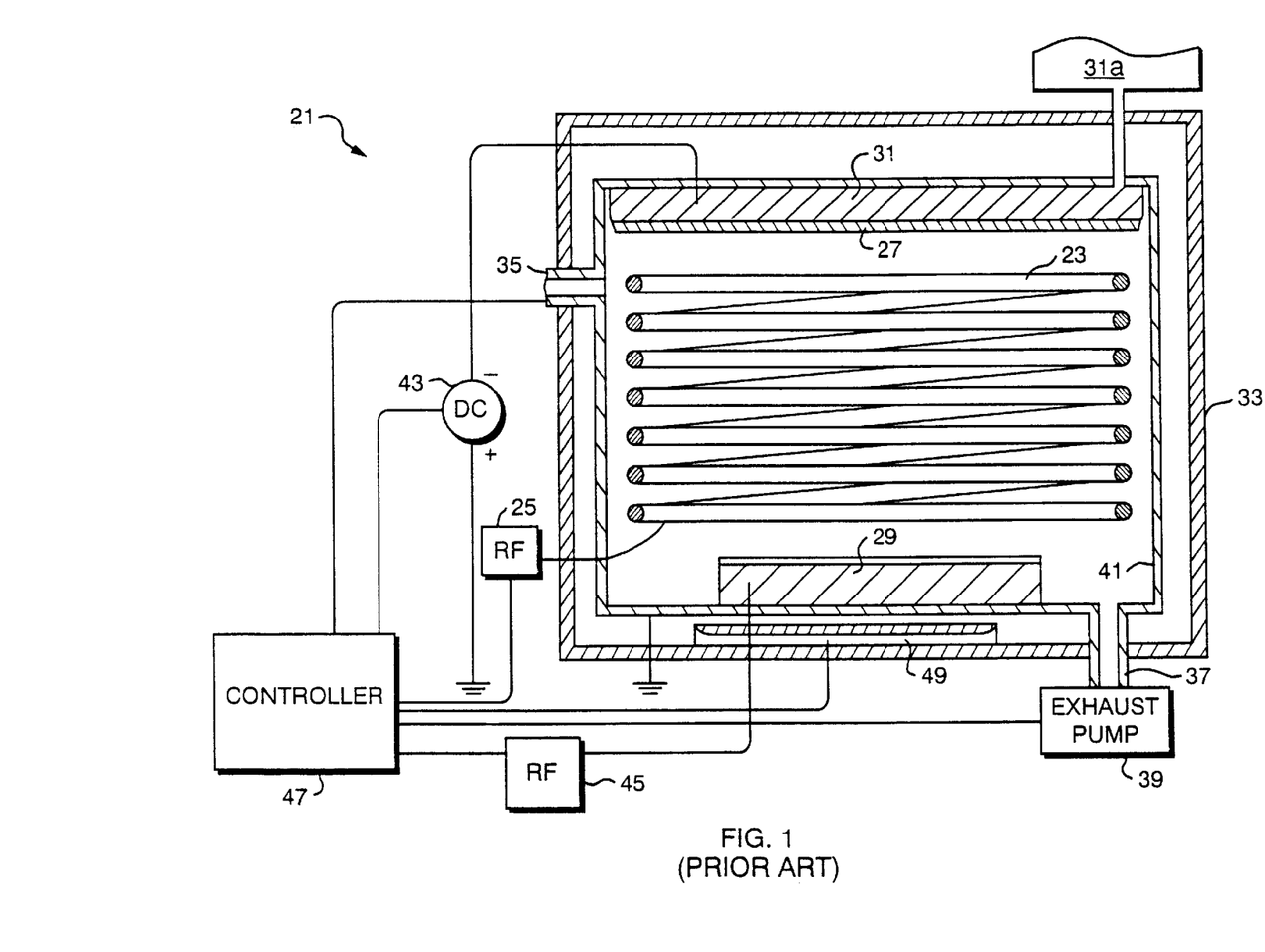
FIG. 1 is a side diagrammatic illustration, in section, of the pertinent portions of a conventional high density plasma sputtering chamber, as previously described.

FIG. 1 is a side diagrammatic illustration, in section, of the pertinent portions of a conventional high density plasma sputtering chamber 21. The sputtering chamber 21 contains a wire coil 23 which is operatively coupled to a first RF power supply 25. The wire coil 23 may comprise a plurality of coils, a single turn coil as shown in FIG. 1, a single turn material strip, or any other similar configuration. The wire coil 23 is positioned along the inner surface of the sputtering chamber 21, between a sputtering target 27 and a wafer pedestal 29. The wafer pedestal 29 is positioned in the lower portion of the sputtering chamber 21 and typically comprises a pedestal heater (not shown) for elevating the temperature of a semiconductor wafer supported by the wafer pedestal 29 during processing within the sputtering chamber 21. The sputtering target 27 is mounted to a water cooled adapter 31 in the upper portion of the sputtering chamber 21 so as to face the substrate receiving surface of the wafer pedestal 29. A cooling system 31a is coupled to the adapter 31 and delivers cooling fluid (e.g., water) thereto.

The sputtering chamber 21 generally includes a vacuum chamber enclosure wall 33 having at least one gas inlet 35 and having an exhaust outlet 37 operatively coupled to an exhaust pump 39 (e.g., a cryopump). A removable shield 41 that surrounds the wire coil 23, the target 27 and the wafer pedestal 29 is provided within the sputtering chamber 21. The shield 41 may be removed for cleaning during chamber maintenance, and the adapter 31 is coupled to the shield 41 (as shown). The sputtering chamber 21 also includes a plurality of bake-out lamps 49 located between the shield 41 and the chamber enclosure wall 33 for baking-out the sputtering chamber 21 as described below.

The sputtering target 27 and the wafer pedestal 29 are electrically isolated from the shield 41. The shield 41 preferably is grounded so that a negative voltage (with respect to grounded shield 41) may be applied to the sputtering target 27 via a DC power supply 43 operatively coupled between the target 27 and ground, and a negative bias may be applied to the wafer pedestal 29 via a second RF power supply 45 operatively coupled between the pedestal 29 and ground. A controller 47 is operatively coupled to the first RF power supply 25, the DC power supply 43, the second RF power supply 45, the gas inlet 35 and the exhaust outlet 37.

To bake-out the sputtering chamber 21, conventionally the bake-out lamps 49 are switched on between about 90% to 100% power when the chamber is at high vacuum. The pedestal heater (not shown) of the wafer pedestal 29 is set at about 200° C., and the water supply to the adapter may or may not be shut-off. The chamber then is allowed to bake-out for about eight hours during which time degassed material will raise the chamber pressure.

For chambers in which titanium, titanium nitride or tantalum nitride are deposited, the above bake-out procedure is sufficient to produce a good base pressure (e.g., low $10^{-8}$ Torr range), ROR (e.g., about 10 to 20 nTorr/min), and good deposited film quality.

The reason for the success of this bake-out procedure is that both titanium and tantalum are excellent gettering materials and, therefore, once deposited on the chamber surfaces during wafer processing, can absorb (or "getter") moisture and other gaseous elements and compounds from the sputtering chamber's atmosphere. Typically, these gettered contaminants do not desorb, even during elevated temperature processing, so that the chamber's base pressure and ROR are not affected by the gettered contaminants. As well, the gettered contaminants do not significantly affect deposited film quality. An eight hour bake-out, however, results in significant process downtime for the chamber being baked-out, as well as for processing equipment upstream and downstream from the processing chamber. Overall fabrication throughput thereby is greatly degraded by conventional bake-out techniques.

When the conventional bake-out procedure is employed within a chamber for copper deposition (e.g., a copper HDP chamber) the results are less satisfactory due to copper's poor gettering properties. For instance, even after an eight hour bake-out, a copper HDP chamber can exhibit a high base pressure (e.g., low $10^{-7}$ Torr), a rapid ROR (e.g., about 200 nTorr/min) and a poor deposited copper film quality (e.g., poor resistivity). Accordingly, a need exists for an improved bake-out method that can be performed more rapidly then conventional bake-out methods (e.g., so as to improve chamber throughput), and that sufficiently bakes out even a copper chamber.

A process related to and often used in conjunction with processing chamber bake-out is processing chamber cooling or "cool-down". As chamber cool-down often is performed following high temperature processing or following chamber bake-out, and can result in significant process downtime for the processing chamber being cooled, as well as for processing equipment upstream and downstream from the processing chamber. For example, the time required to perform chamber maintenance and repair is initially determined by the temperature of the various chamber components which must be sufficiently cooled before handling. Opening a chamber at elevated temperatures exposes personnel to safety hazards and may result in oxidation and contamination of the chamber.

In order to mitigate the effects of contamination, chambers are typically cooled under high vacuum conditions. Because some processing chamber components are operated at temperatures in excess of 600° C., cool-down time may be on the order of hours. The exact time required to reach a desired temperature depends on the chamber. For example, chamber components having high thermal conductivity (such as aluminum components) are capable of cooling more rapidly than components having low thermal conductivity (such as stainless steel components).

Figure 2:
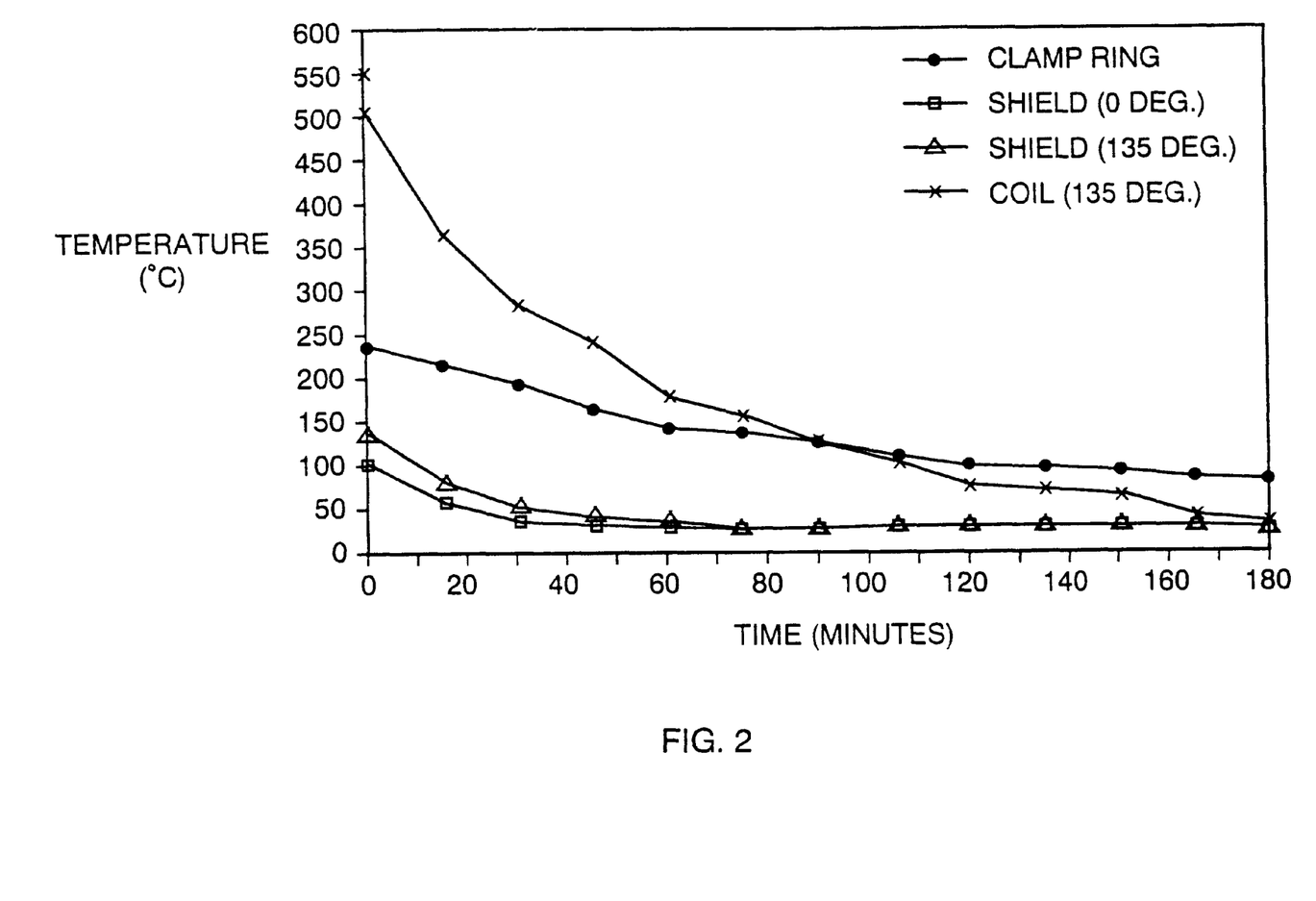
FIG. 2 is a graphical representation of the cooling curve for a typical ion metal plasma process chamber.

FIG. 2 shows a cooling curve for a typical ionized metal plasma chamber cooled according to current practice. The chamber was operated under normal conditions and then allowed to cool under vacuum. The temperatures of a clamp ring, a coil, and a shield were measured and recorded. For comparison, the temperature of the shield was measured in two locations, zero (0) degrees from the RF feedthrough and one hundred thirty-five (135) degrees from the feedthrough. Because significant oxidation can occur at temperatures at or above 100° C., the desired temperature before opening the chamber is preferably below about 50° C. As can be seen from FIG. 2, the time required for all components to reach the desired temperature is at least three (3) hours. Thus, the chamber remains idle and nonproductive during this cooling period plus the time required to perform the routine maintenance or repair, and to bake-out the chamber thereafter.

One attempt to cool a chamber (specifically, a Czochralski silicon growth chamber) is found in U.S. Pat. No. 5,676,751, entitled, "Rapid Cooling of CZ Silicon Crystal Growth System," by Banan et al. The approach disclosed therein involves disposing a porous insulating ring within the chamber and then saturating the ring with a gas. The gas is intended to improve the thermal conductivity of the insulating ring and to provide an annular cooling medium for efficient heat exchange. Because the cooling ring is believed to transfer heat more rapidly than other chamber components the overall cooling time is reduced.

However, such an insulating system requires entirely new chambers having enlarged capacities to accommodate the insulating ring. Further, the porosity of the ring makes it unsuitable for chambers wherein process gases are needed such as CVD chambers or wherein a plasma is used such as a PVD, a CVD, or an IMP chamber. In such chambers, the process and plasma gases would be absorbed by the ring and/or outgassed during lower vacuum conditions thereby upsetting the deposition process and contaminating substrates.

Therefore, there remains a need for an apparatus and method which provides rapid cool-down of a vacuum chamber and its components from an elevated temperature which protects the chamber from contamination and oxidation while also ensuring the safety of personnel. Preferably, such a method may be easily adopted by existing vacuum chambers.

SUMMARY OF THE INVENTION

To address the needs of the prior art a novel method and apparatus for baking-out and for cooling-down a vacuum chamber are provided. In a first aspect of the invention, rather than maintain the chamber to a low pressure, a dry inert gas (e.g., semiconductor grade argon, helium, nitrogen, etc.) which conducts heat from the vacuum chamber's bake-out lamps to the shield and from the shield to the other parts within the vacuum chamber is introduced during chamber bake-out. The dense inert gas behaves as a conduction path between the bake-out lamps and the shield and between the shield and the chamber parts surrounded by the shield (e.g., the target, the coil, the pedestal, etc.) so that the shield and other parts are heated more rapidly and to a higher temperature than conventional bake-out techniques that are performed under high vacuum conditions. With use of the present invention, even copper chambers are sufficiently baked-out in a fraction of the time required to bake-out a chamber by conventional techniques. Applicants have found that the inert gas does not adversely become trapped in chamber components or later outgas, and due to the uniform heating of chamber components, contaminants desorbed from one chamber surface do not reabsorb on another chamber surface.

To bake-out a vacuum chamber the chamber is pumped out and is then isolated from the chamber's vacuum pump. A volume of inert gas such as argon, helium or nitrogen is injected into the chamber, the chamber's bake-out lamps are turned on and the cooling fluid flow to the adapter is turned off. The inert gas may be injected, the baking lamps may be turned on and the cooling fluid flow to the adapter may be turned off simultaneously or in any order.

Preferably, the amount of inert gas injected raises the chamber pressure to about 500 Torr (e.g., close to but less than atmospheric pressure).

Because of the rapid transfer of heat between the bake-out lamps and the shield and between the shield and the other chamber parts through the gas as a heat transfer medium, adequate chamber bake-out occurs quickly (e.g., typically in about two hours depending on the chamber involved, the pressure of the inert gas, the inert gas employed—gasses of smaller atomic mass conduct heat faster, etc.). After the chamber is sufficiently baked-out, the baking lamps are turned off and cooling fluid is flowed to the adapter so as to cool the inert gas before it is pumped from the vacuum chamber (e.g., to prevent overheating of the cryopump). Because the adapter and the shield are coupled, the adapter cools the shield, and the shield cools the inert gas. The inert gas is quickly cooled thereby (e.g., typically in about one hour). After the inert gas has cooled, it is pumped from the vacuum chamber, and the bake-out of the chamber is complete.

With use of the inventive bake-out method, chamber bake-out can be performed in far less than half the time of conventional bake-out techniques. Specifically, the present inventor have found that using the conventional bake-out technique described with reference to FIG. 1, the aluminum shield of a copper HDP chamber reaches only a temperature of about 120° C. even for an eight hour bake-out. However, by employing the inventive bake-out method, the same aluminum shield can reach 200 to 300° C. during bake-out. In fact, care must be taken not to melt the aluminum shield due to the rapid conduction of heat between the bake-out lamps and the shield. Accordingly, a highly improved bake-out method is provided.

In a second aspect of the invention, a process chamber is provided having at least one source of a cooling gas having a high thermal conductivity. The gas is input into the chamber and allowed to reside therein for a period of time. Once a target temperature is reached for the chamber and its components, the cooling gas is evacuated.

In another aspect of the invention, a cooling gas having a high thermal conductivity is input into a process chamber until a desired pressure is reached. The chamber is allowed to cool for a period of time and then the cooling gas is evacuated. During the cooling stage, a pressure equilibrium may be maintained by periodically flowing additional cooling gas into the chamber.

In yet another aspect of the invention, a cooling gas is charged into a process chamber until a desired pressure is established in the chamber. The cooling gas in brought into contact with chamber components to allow for thermal conduction therebetween. During the cooling stage, a pressure equilibrium is maintained in the chamber by providing a constant flow of the cooling gas into the chamber while simultaneously evacuating the chamber at a substantially equal rate by engaging a vacuum pump.

In still another aspect of the present invention, a process chamber is purged by a purge gas and a cooling gas is then input into the chamber. Thereafter, the cooling gas is evacuated, cooled, and returned to the chamber. The cooling gas is permitted to reside within the chamber for a period of time or, alternatively, continuously recycled. Any of the above cooling aspects may be used to affect more rapid cooling of a processing chamber following chamber bake-out.

Other objects, features and advantages of the present invention will become more fully apparent from the following detailed description of the preferred embodiments, the appended claims and the accompanying drawings.

DETAILED DESCRIPTION OF THE PREFERRED EMBODIMENTS

Figure 3A:
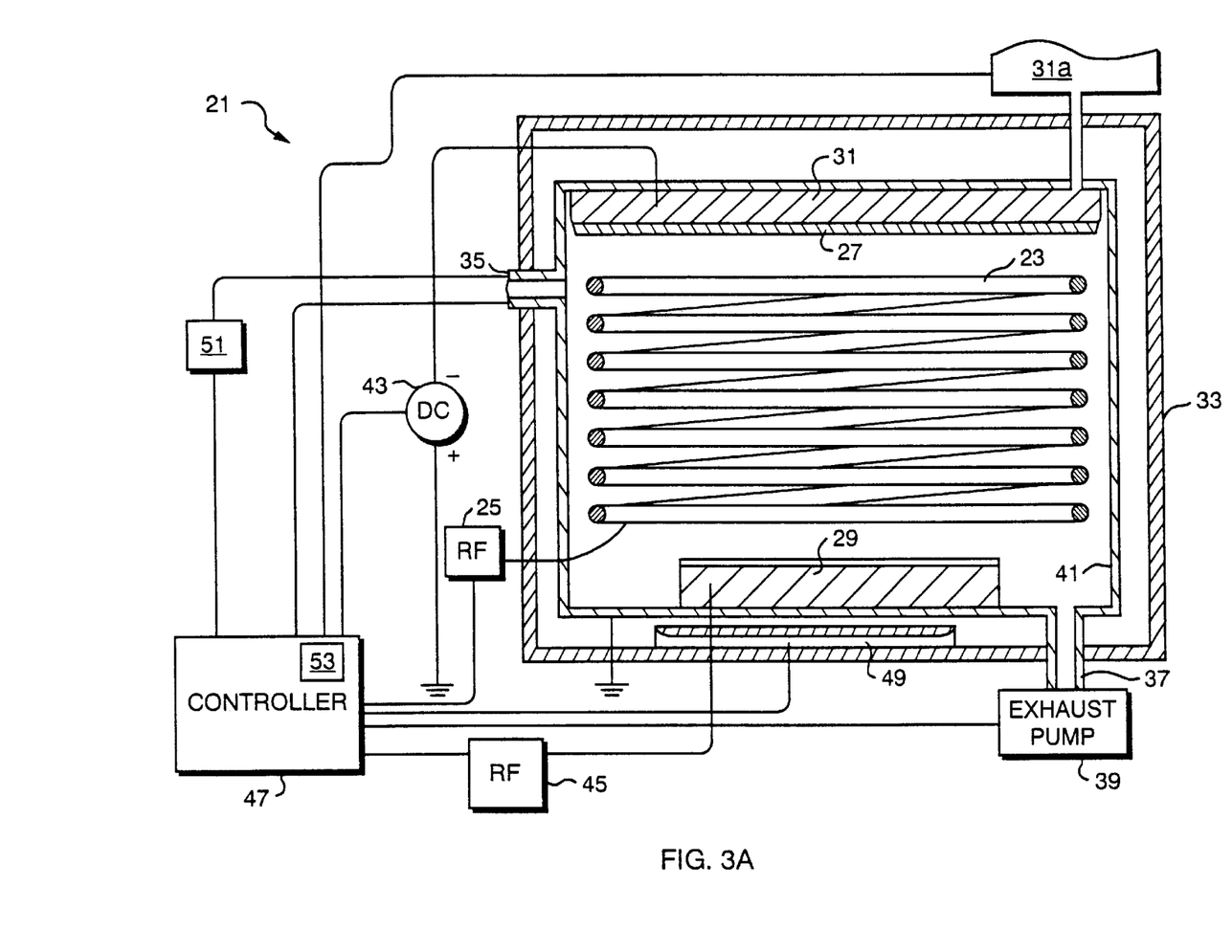
FIG. 3A is a side diagrammatic illustration, in section, of the pertinent portions of an inventive high density plasma sputtering chamber configured for performing the inventive bake-out method.

FIG. 3A is a side diagrammatic illustration, in section, of the pertinent portions of an inventive high density plasma sputtering chamber 21' configured for performing the bake-out method of the present invention. In addition to the components 23–49 of the conventional sputtering chamber 21, the inventive sputtering chamber 21' comprises a source of inert gas 51 operatively coupled to the gas inlet 35 and to the controller 47. Additionally, the controller 47 is operatively coupled to the cooling system 31a and comprises a memory 53 preferably having a program stored therein for automatically performing the inventive bake-out method as described below.

Figure 3B:
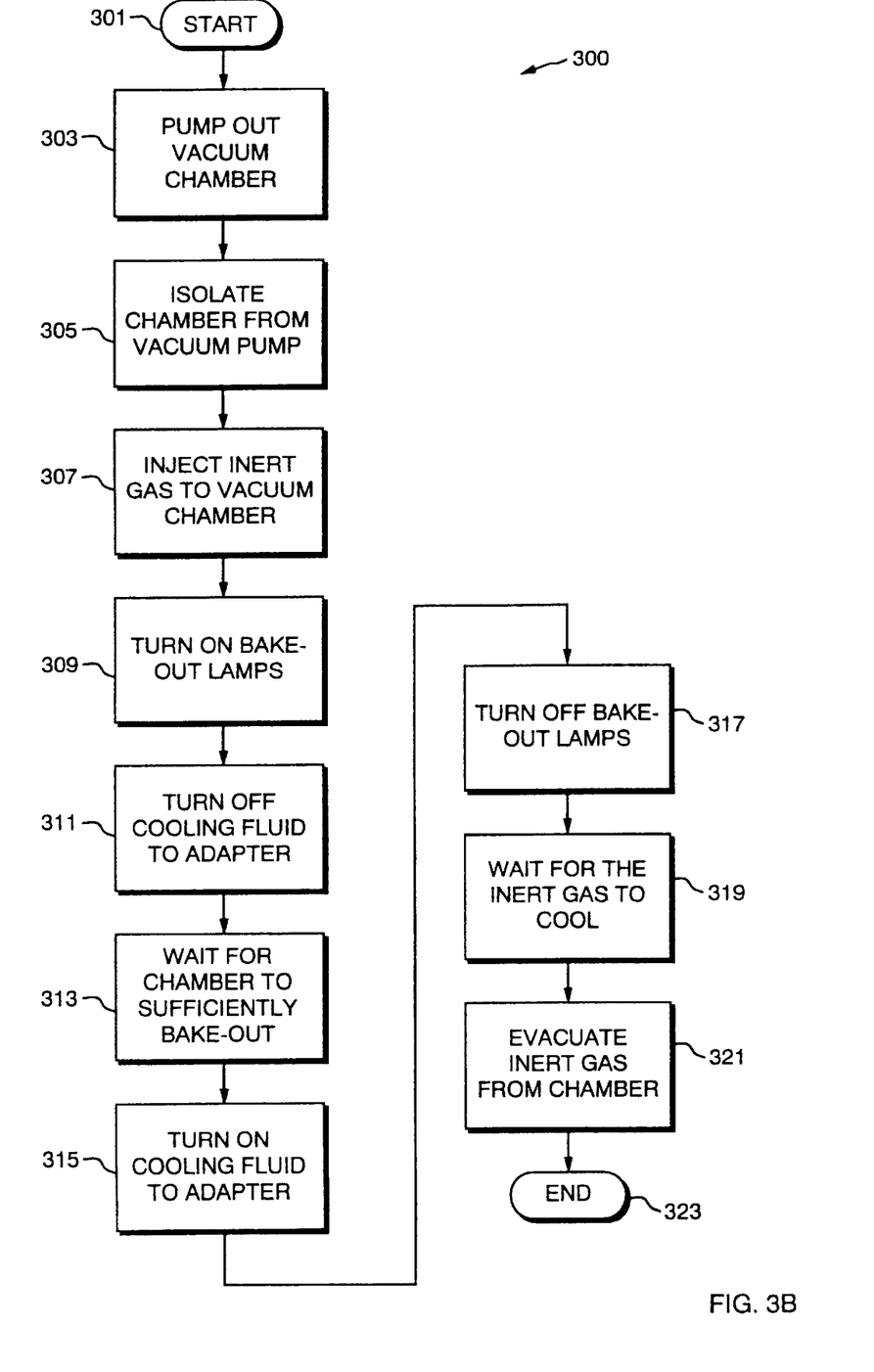
FIG. 3B is a flowchart of an inventive bake-out method for baking-out a vacuum chamber.

FIG. 3B is a flowchart of an inventive bake-out method 300 that may be performed on any vacuum chamber, but which is described with reference to the inventive sputtering chamber 21' of FIG. 3A. The inventive bake-out method 300 starts at step 301.

In step 303, the sputtering chamber 21' is evacuated or "pumped out" via the exhaust pump 39. Typically the sputtering chamber 21' is pumped out following chamber maintenance and cleaning. The sputtering chamber 21' is preferably pumped to its "pre-bake-out" base level (e.g., the lowest level it can be pumped to prior to bake-out).

In step 305, the sputtering chamber 21' is isolated from the pump 39 in preparation for the introduction of inert gas into the sputtering chamber 21' in step 307.

In step 307, an inert gas such as argon, helium, nitrogen or the like is injected into the sputtering chamber 21' from the source of inert gas 51 (through the gas inlet 35). Preferably sufficient inert gas is flowed into the sputtering chamber 21' to raise the chamber's pressure to slightly below atmospheric pressure (to ensure the chamber is not inadvertently opened and exposed to atmosphere due to a positive pressure within the chamber). Most preferably chamber pressure is raised to about 500 Torr.

Thereafter, in step 309 the bake-out lamps 49 are turned on (e.g., at about 90% to 100% power), and in step 311 the cooling fluid supply to the adapter 31 is shut off. Turning off the cooling fluid supply to the adapter 31 allows the shield 41 to heat to a higher and more uniform temperature because the shield is operatively coupled to the adapter and looses heat thereto. It will be understood that steps 307–311 may be performed simultaneously or in any order.

The dense inert gas within the sputtering chamber 21' behaves as a conduction path between the bake-out lamps 49 and the shield 41, and between the shield 41 and the coil 23, the target 27, the wafer pedestal 29, the adapter 31 and any other components within the sputtering chamber 21'. Because of the rapid transfer of heat through the chamber and between isolated chamber components via the inert gas, the sputtering chamber 21' is baked-out quickly (e.g., typically in about two hours depending on the chamber size, the pressure of the inert gas, the inert gas employed, etc.). Preferably the shield 41 reaches a temperature of at least 200° C. to 300° C. during chamber bake-out to ensure adequate desorption of potential contaminants from chamber surfaces.

In step 313, bake-out of the sputtering chamber 21' is continued until enough moisture and other gaseous elements and compounds have been desorbed from the chamber's surface to achieve the desired base pressure, rate of rise and deposited film quality for the sputtering chamber 21'. Thereafter, in step 315, to cool the inert gas (e.g., to prevent overheating of the pump 39 when the inert gas is pumped from the sputtering chamber 21') cooling fluid is flowed to the adapter 31, and in step 317 the bake-out lamps 49 are turned off. Step 315 and 317 may be performed simultaneously or in any order.

Because the adapter 31 and the shield 41 are coupled, the adapter 31 cools the shield 41, and the shield 41 cools the inert gas. The inert gas thereby is cooled quickly (e.g., typically in about one hour). Accordingly, in step 319, a sufficient time is provided to allow the inert gas to cool.

Thereafter, in step 321, the inert gas is evacuated from the sputtering chamber 21' via the pump 39. In step 323 the inventive bake-out method 300 ends.

The higher temperatures to which the shield 41, the coil 23, the target 27 and/or the adapter 31 are heated, significantly improves chamber bake-out, even for chambers employing poor gettering materials such as copper, and even though bake-out time is significantly reduced. Therefore, following the inventive bake-out method 300, the sputtering chamber 21' has a lower base pressure, a lower rate of rise and produces a higher quality deposited film than that achieved by conventional bake-out methods.

As previously stated, the memory 53 preferably contains a program for automatically performing the inventive bake-out method 300 on the sputtering chamber 21' of FIG. 3A. Specifically, the memory 53 directs the controller 47 to control the cooling system 31a, the gas inlet 35, the gas outlet 37, the pump 39, the bake-out lamps 49 and the inert gas source 51 so as to perform the inventive bake-out method 300.

Figure 4:
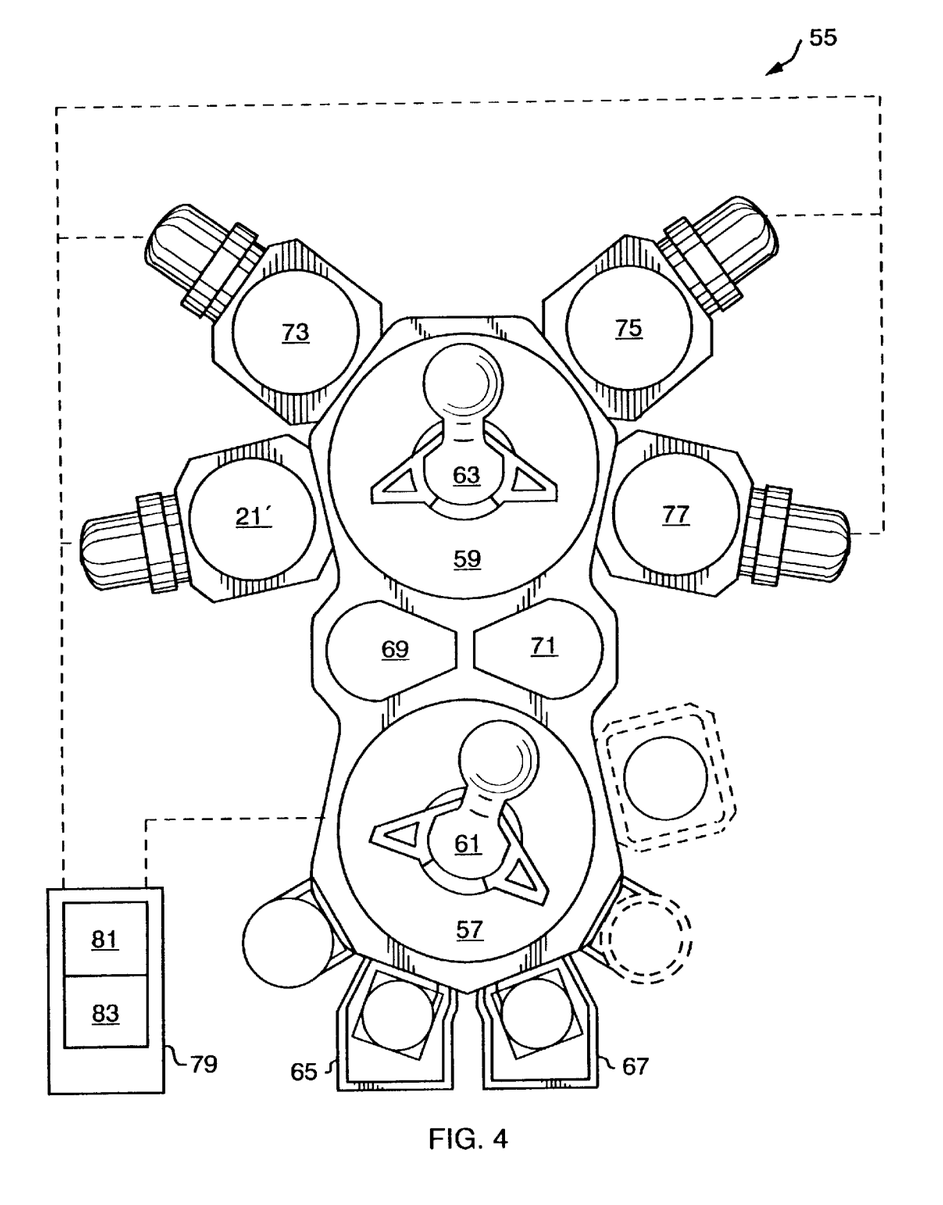
FIG. 4 is a top plan view of an automated semiconductor manufacturing tool employing the inventive high density plasma sputtering chamber of FIG. 3.

FIG. 4 is a top plan view of an automated semiconductor manufacturing tool 55 useful for performing the inventive method. Specifically, the automated semiconductor manufacturing tool 55 comprises a pair of chambers, a buffer chamber 57 and a transfer chamber 59 which house a first and a second wafer handler 61, 63, respectively. The buffer chamber 57 is operatively coupled to a pair of load locks 65, 67 and to a pair of pass-through chambers 69 and 71. Other chambers such as degassing or cool-down chambers also may be coupled to the buffer chamber 57.

The transfer chamber 59 is coupled to the pass-through chambers 69, 71, and to a plurality of processing chambers 73, 75 and 77. Most importantly the transfer chamber 59 is coupled to the inventive sputtering chamber 21' of FIG. 3A.

A controller 79 comprising a microprocessor 81 and a memory 83 is operatively coupled to the first and second wafer handlers 61, 63, to the load locks 65, 67, to the four processing chambers 21', 73–77, and to the various slit valves (not shown) for selectively sealing the load locks, pass-through chambers and processing chambers. The memory 83 contains a program for performing transfers between and processing within each of the processing chambers. The memory 83 also may be programmed to perform the inventive bake-out method on any of the processing chambers 21', 73–77. Note that because of the significant decrease in bake-out time achieved with the inventive bake-out method, the overall productivity of the tool 55 is significantly increased, as less downtime is experienced by chambers employing the inventive bake-out method, as well as by chambers upstream and downstream therefrom.

Figure 5:
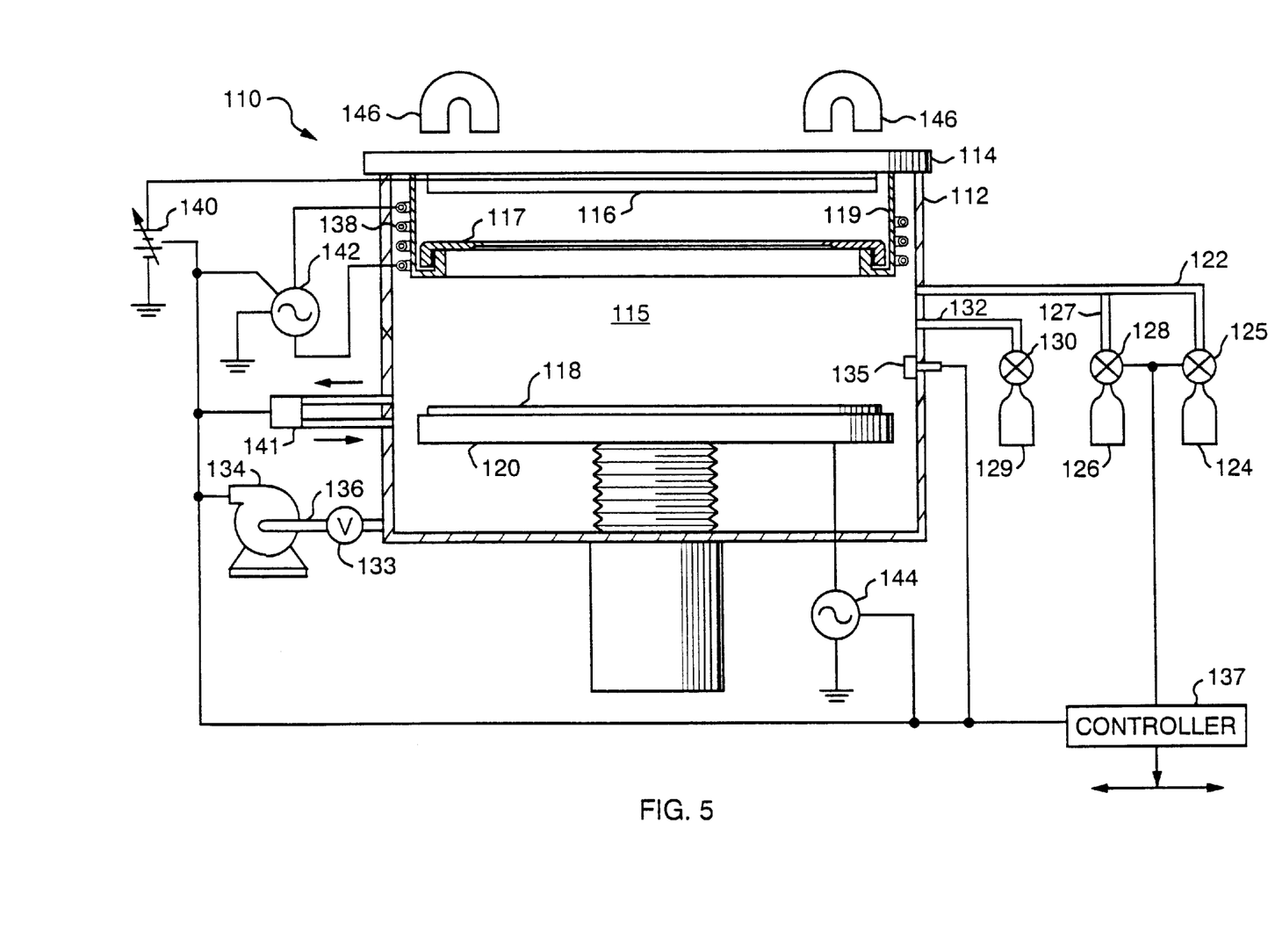
FIG. 5 is cross sectional view of an ion metal plasma process chamber.

FIG. 5 is a schematic cross-sectional view of an inductively coupled ion metal plasma chamber 110 suitable for performing a PVD process. As shown in this figure, chamber 110 is defined principally by a chamber wall 112 and a target backing plate 114. A PVD target 116, having a composition comprising at least part of the material being sputter deposited, is mounted to the target backing plate 114 and defines an upper boundary of a processing region 115. The lateral boundary of the processing region 115 is defined by a shield 119 which supports a clamp ring 117 in the chamber 110. A substrate 118 is shown supported on a movable pedestal 120 disposed opposite the target 116. A high vacuum pump 134, such as a cryogenic pump, communicates with the chamber 110 through an exhaust line 136 having a throttle valve 133 disposed therein. A thermocouple 135 disposed in the chamber wall 112 monitors the operating temperature of the chamber 110. A high purity sputtering gas, such as argon, is supplied to the chamber 110 via a first gas line 122 from a first gas source 124 as metered by mass flow controller 125. A second gas source 126 supplies a venting gas via gas line 127 at a rate determined by a flow controller 128. A cooling gas source 129 and mass flow controller 130 are shown coupled to the chamber 110 to supply a post-processing cooling gas. Although the cooling gas source 129 is shown here having a dedicated second gas line 132 leading to the chamber, in another embodiment the gas source 129 may communicate with the chamber 110 via the first gas line 122. Additional gas sources may be provided to supply more than one post-processing cooling gas.

An inductive coil 138 is helically disposed along the chamber wall 112 adjacent the processing region 115. Three independent power supplies are used to achieve the desired electrical conditions in the chamber 110. A DC power supply 140 is coupled to the target 116 while an RF power source 142 supplies electrical power in the megahertz range to the inductive coil 138. Another RF power source 144 applies electrical power in the frequency range of 100 KHz to a few megahertz to the pedestal 120 in order to bias it with respect to the plasma. Magnets 146 are disposed behind the target 116 to create a magnetic field adjacent to the target 116. Each of the various chamber components are connected to a controller 137.

In operation, the pedestal 120 raises the substrate 118 to a processing position at which position the substrate 118 is secured to the pedestal by the clamp ring 117. An inert gas, such as argon, is then flowed from the first gas source 124. The DC power supply 140 negatively biases the target 116 with respect to the pedestal 120 and causes the argon gas to ionize and form a plasma. The RF coil 138 increases the plasma flux, that is, increases the density of ionized particles. The magnets 146 act to significantly increase the density of the plasma adjacent to the target 116 thereby improving the sputtering efficiency. The positively charged ions are attracted to the negatively biased target 116 with enough energy that the ions sputter particles from the target 116. The sputtered particles travel primarily along ballistic paths, and some of them strike the substrate 118 to deposit on the substrate. The RF power source 144 provides an additional attractive force to the particles dislodged from the target 116 by capacitively coupling the pedestal and the plasma.

In a dynamic system, such as in the process chamber 110 described above, gas is flowed into the chamber 110 and the pressure is preferably held constant at a pre-determined process pressure. The pump 134 is operated concurrently to achieve stabilization of the pressure and to maintain a steady pressure during the processing steps. The mass flow controller 125 allows the gas to be flowed into the chamber 110 at a constant rate or at a variable rate as needed. Once a desired amount of deposition is achieved, the flow of gas from the first gas source 124 and the power from the power supplies is terminated. The pump 134 and the second gas source 126 then cooperate to vent the chamber 110 after which the substrate 118 is removed.

Figure 6:
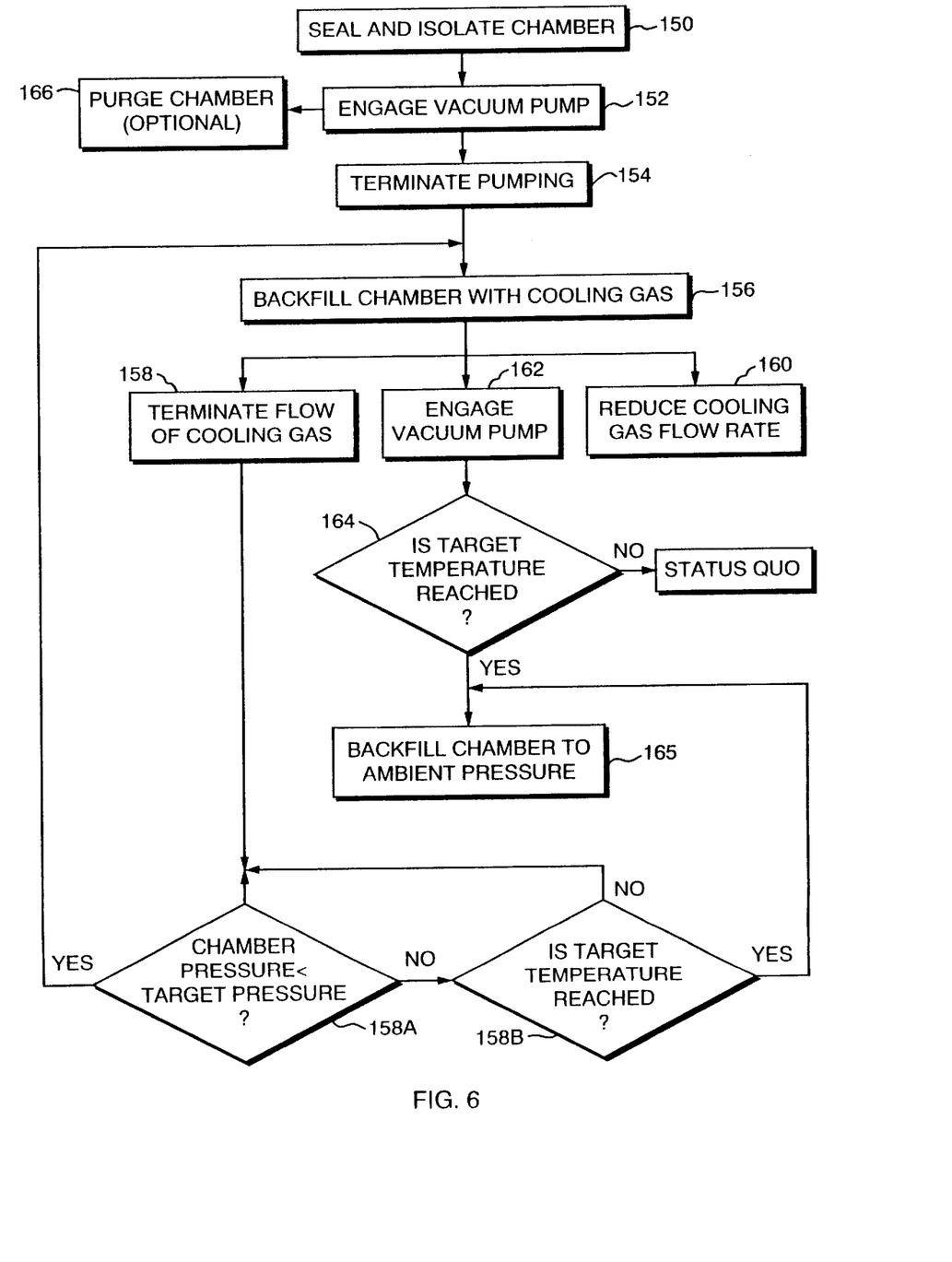
FIG. 6 is a flow chart representing the steps of an inventive cooling method in accordance with the present invention.

Upon removal of the substrate 118, the chamber 110 is cooled according to the present invention as depicted in the flow chart of FIG. 6. At step 150, the chamber 110 is sealed and the gas sources 124 and 126 are isolated from the chamber 110 by their respective mass flow controllers 125, 128. At step 152, the pump 134 is engaged in order to evacuate the chamber 110 to a pressure preferably less than about 1 Torr. Most preferably, a high vacuum condition (e.g., on the order of $10^{-9}$ Torr) is achieved so that the subsequently introduced cooling gas, described below, is not diluted by the presence of gases having inferior thermal conductivity. At steps 154 and 156, the pump 134 is terminated and the mass flow controller 130 opens the cooling gas source 129 to the chamber 110 to backfill the chamber 110 with a cooling gas therein until a desired pressure is achieved. The cooling gas (or gases) preferably has a high thermal conductivity and includes such gases as nitrogen (thermal conductivity of $7.18 \times 10^5$ g.-cal/(sec.·cm$^2$) (° C./cm) at 100° C.), argon (thermal conductivity of $5.087\times10^5$ g.-cal/(sec.·cm$^2$) (° C./cm) at 100° C.), or helium (thermal conductivity of $39.85\times10^5$ g.-cal/(sec.·cm$^2$) (° C./cm) at 100° C.). While helium and nitrogen are preferred, any gas having a thermal conductivity greater than $5\times10^5$ g.-cal/(sec.·cm$^2$) (° C./cm) at 100° C. may be used in accordance with the present invention. Gases with thermal conductivities lower than $5\times10^5$ g.-cal/(sec.·cm$^2$) (° C.,/cm) may be used, but are not preferred because the cooling rate will be lower. The temperature of the cooling gas prior to its introduction into the chamber depends upon the particular gas used. The gases are preferably cooled to a lower limit above a condensation temperature. In general, the temperature will be ambient temperature, or between about 25 and about 30° C.

The desired pressure may be between about 1 and 760 Torr and preferably about 500 Torr. Although pressures below 1 Torr may be used, in general higher pressures are preferred because thermal exchange between the gas medium and the vacuum system is proportionally increased. However, at pressures above approximately 500–550 Torr, the concentration of contaminants in the cooling gases (all purified gases still contain some level of contaminants) increases thereby contaminating the chamber and components. The presence of contaminants results in a critical pressure level, or saturation level, above which the increase in thermal exchange is negligible and danger of contamination becomes prohibitive. Thus, decreasing thermal exchange provides a lower pressure limitation and contamination provides an upper pressure limitation.

Once the desired chamber pressure is achieved, the flow of cooling gas is terminated, as indicated at step 158, and the cooling gas is permitted to reside in the chamber for a period of time as determined by the desired temperature. During the cool down cycle, the cooling gas flow is optionally resumed periodically to compensate for pressure reduction due to cooling as indicated by step 158a. At step 158b, the temperature is checked against the target temperature; if the chamber temperature is equal to or less than the target temperature the chamber is backfilled to ambient pressure and may then be opened as indicated by step 165. The processing parameters such as gas flow rates and pressures as well as the positioning of the substrate are controlled by a computer control described below.

The present invention also contemplates other alternatives which may be used to maintain a desired pressure while cooling the chamber after step 156. In each case, the chamber 110 is cooled to a target temperature at which point the chamber 110 is backfilled to ambient pressure and may be opened as indicated by steps 164 and 165. Step 160 indicates one alternative where the cooling gas flow is reduced to a flow rate sufficient to maintain the chamber pressure within the desired range, accounting for pressure reduction due to cooling. The pressure may be continuously monitored and adjusted by controlling the gas flow rate according to the computer control described in detail below.

Another alternative, indicated at step 162, provides continuously flowing the cooling gas into the chamber 110 while simultaneously operating the pump 134 such that the cooling gas is continuously introduced and evacuated from the chamber 10 at a rate sufficient to hold the pressure substantially constant. As in each of the preceding embodiments, the gas flow rate is controlled and adjusted by the computer control which responds to the chamber pressure.

Those skilled in the art will recognize alternative methods of cooling the chamber 110 which are contemplated by the present invention. For instance, the chamber 110 may initially be purged of residual processing gases by flowing the cooling gas through the chamber 110 while evacuating the cooling gas from the lower end of the chamber 110 by the pump 134 as indicated by step 166 in FIG. 6. The present invention may be further enhanced by providing a cooling system 141 through which the cooling gas may be flowed and then recycled to the chamber 110. A further optional step is to monitor the chamber temperature, evacuate the chamber 110 once the cooling gas reaches some predetermined temperature greater than the final target temperature, and then backfill the chamber with a new supply of cooling gas. This cycle is repeated until the target temperature is reached. Additionally, the cooling curve of present invention may be improved by equipping the chamber 110 with multiple cooling gas sources and introducing a mixture of cooling gases (such as argon, nitrogen, helium, etc.) into the chamber 110.

Because the thermal conductivity of gases varies with temperature, the present invention may be optimized by selectively introducing different gases according to their thermal conductivity at a given temperature range. For example, a first cooling gas may be introduced to cool the chamber from a first temperature to a second temperature. Subsequently, a second cooling gas having a thermal conductivity greater than the first cooling gas at temperatures below the second temperature is introduced to cool the chamber from the second temperature to a third temperature. In a final stage, a third cooling gas having a thermal conductivity greater than both the first and the second cooling gases at temperatures below the third temperature is introduced to cool the chamber to a desired temperature at which the chamber may be safely opened without risk to personnel and at which oxidation is minimized. These series of steps are merely illustrative of one embodiment of the present invention. Other approaches using two or more gases having varying thermal conductivities may be without departing from the spirit and scope of the present invention. This multi-stage approach allows for a rapid chamber cool-down by selecting the most thermally conductive gas at a particular temperature.

The total time required to cool down a chamber is a function of many factors. Therefore cool-down time may be reduced by streamlining each of the steps recited above. For example, because the cooling curve is improved at higher pressures, the time required to backfill the chamber to a particular pressure with the cooling gas should be minimized. The precise times are, of course, dependent on the particular chamber capacity. However, a pressure of 500 Torr is preferably reached in approximately 1 minute or less.

The described embodiment is only representative of invention and should not be considered limiting of its scope. Although the above description discusses the present invention in the context of an ionized metal plasma chamber, other chambers which operate at elevated temperatures such as CVD chambers, RTP chambers, and PVD chambers may use the present invention to advantage.

The processes described above can be implemented using a computer program product that runs on a conventional computer system comprising a central processor unit (CPU) connected to a memory system with peripheral control components, such as for example a 68400 microprocessor, commercially available from Synenergy Microsystems, California. The computer program code can be written in any conventional computer readable programming language such as for example 68000 assembly language, C, C++, or Pascal. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of pre-compiled windows library routines. To execute the linked compiled object code, the system user invokes the object code, causing the computer system to load the code in memory from which the CPU reads and executes the code to perform the tasks identified in the program.

A gas control subroutine has program code for controlling gas composition and flow rates. Generally, the gas supply lines 122, 132 for each of the gases comprise one or more components that can be used to measure and control the flow of gas into the chamber 110 such as the mass flow controllers 125, 128, 130 shown in FIG. 5. The gas control subroutine ramps up/down the mass flow controllers 125, 128, 130 to obtain the desired gas flow rate. The gas control subroutine is invoked by the chamber manager subroutine, as are all chamber component subroutines, and receives from the chamber manager subroutine parameters related to the desired gas flow rates. Typically, the gas control subroutine operates by opening the gas supply lines 122, 132, and repeatedly (i) reading the necessary mass flow controllers 125, 128, 130, (ii) comparing the readings to the desired flow rates received from the chamber manager subroutine, and (iii) adjusting the flow rates of the gas supply lines 122, 132 as necessary. Furthermore, the gas control subroutine includes steps for monitoring the gas flow rates for unsafe rates and activating the mass flow controllers when an unsafe condition is detected.

When the pressure control subroutine is invoked, the desired or target pressure level is received as a parameter from the chamber manager subroutine. The pressure control subroutine operates to measure the pressure in the chamber 110 by reading one or more conventional pressure manometers connected to the chamber 110, compare the measure value(s) to the target pressure, obtain PID (proportional, integral, and differential) values from a stored pressure table corresponding to the target pressure, and adjust the throttle valve 133 according to the PID values obtained from the pressure table.

Figure 7:
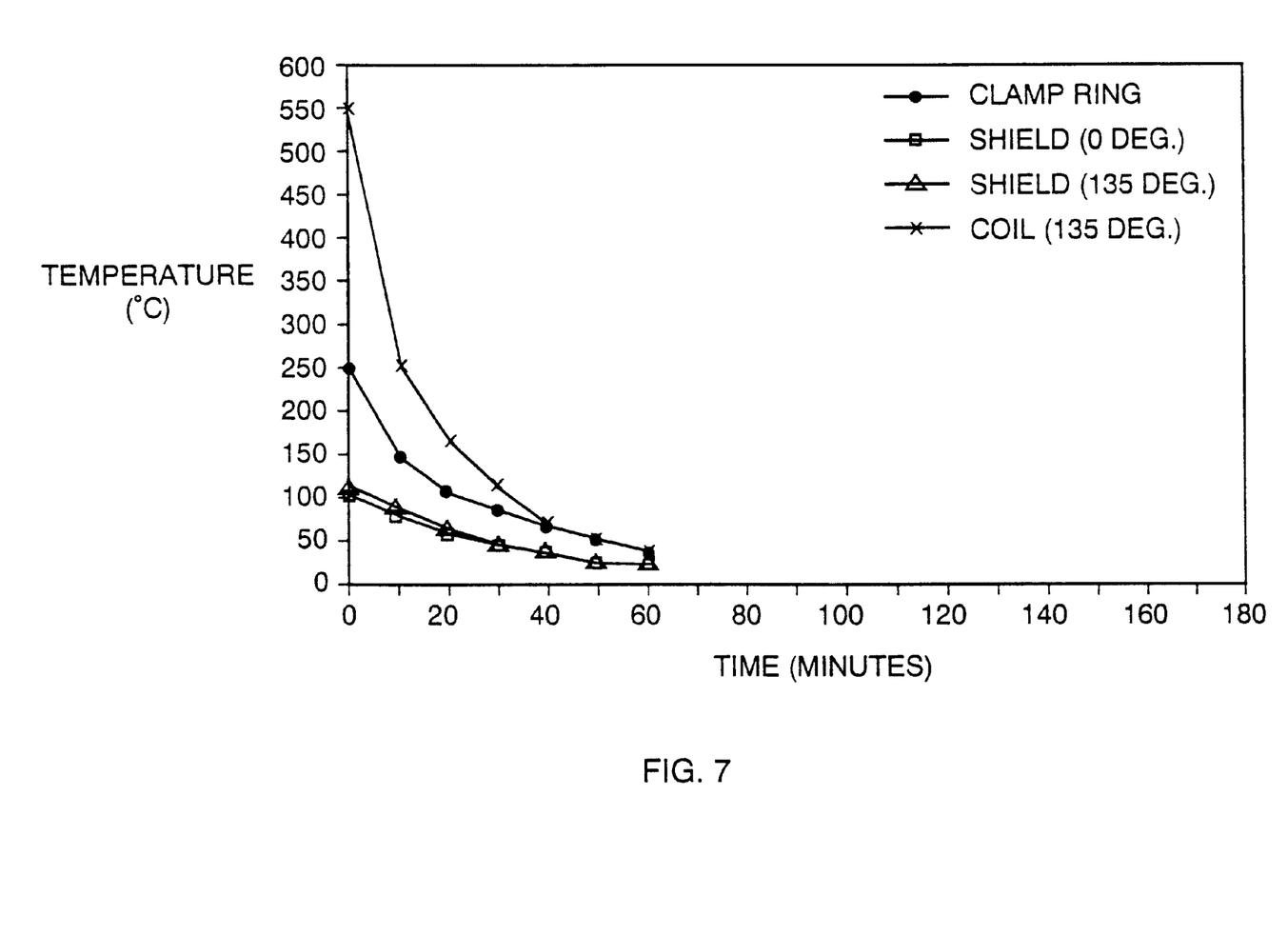
FIG. 7 is a graphical representation of the cooling curve for a chamber employing the inventive cooling method.

FIG. 7 is a graphical representation of the results obtained by a method of the present invention in the same ionized metal plasma chamber used to obtain the data shown in FIG. 2. The chamber is an IMP chamber available from Applied Materials, Inc. located in Santa Clara, Calif. The chamber was operated under normal conditions and then vented with an inert gas. Nitrogen was then flowed into the chamber for about one minute until a pressure of approximately 550 Torr was reached. Prior to its introduction into the chamber, the nitrogen was maintained above condensation temperature and at about 25 to 30° C. (i.e., ambient temperature). The cooling gas was then allowed to reside in chamber. FIG. 7 shows the decreasing temperature over time of three components: a clamp ring, a coil, and a shield (for comparison the temperature of the shield was measured at zero (0) degrees from the RF feedthrough and one hundred thirty-five (135) degrees from the RF feedthrough). As can be seen from comparison with FIG. 2, the method of the present achieved a significant reduction in the time needed to cool the chamber components on the order of hours.

The foregoing description discloses only the preferred embodiments of the invention, modifications of the above disclosed apparatus and method which fall within the scope of the invention will be readily apparent to those of ordinary skill in the art. For instance, the inventive bake-out may be performed with any vacuum chamber. Specific bake-out times, cooling times, inert gas pressure and the like will vary widely depending on the pre-bake-out condition of the vacuum chamber, the size of the chamber, the various shields, pedestals, targets, etc., within the chamber, and with other similar factors. Further, the process may be performed manually, automatically or semi-automatically.

Accordingly, while the present invention has been disclosed in connection with the preferred embodiments thereof, it should be understood that other embodiments may fall within the spirit and scope of the invention, as defined by the following claims.

The invention claimed is:

1. A semiconductor processing apparatus comprising:

a semiconductor processing chamber having an inlet and an outlet;

a semiconductor wafer support located within the semiconductor processing chamber for supporting a semiconductor wafer during processing within the semiconductor processing chamber;

a vacuum pump operatively coupled to the semiconductor processing chamber's outlet for evacuating the semiconductor processing chamber;

an inert gas source operatively coupled to the semiconductor processing chamber's inlet for injecting an inert gas into the semiconductor processing chamber;

a bake-out mechanism located within the semiconductor processing chamber for baking-out the semiconductor processing chamber; and a bake-out controller operatively coupled to the semiconductor processing chamber's inlet and outlet and to the bake-out mechanism, the bake-out controller programmed for:

evacuating the semiconductor processing chamber via the vacuum pump to thereby evacuate the semiconductor processing chamber;

isolating the semiconductor processing chamber from the vacuum pump;

injecting inert gas from the inert gas source into the semiconductor processing chamber so as to raise the pressure within the semiconductor processing chamber to a bake-out pressure; and baking-out the semiconductor processing chamber via the bake-out mechanism in the presence of the inert gas while maintaining the semiconductor processing chamber isolated from the vacuum pump.

2. The semiconductor processing apparatus of claim 1 wherein the inert gas comprises an inert gas selected from the group consisting of argon, helium and nitrogen.

3. The semiconductor processing apparatus of claim 1 wherein the bake-out pressure is about 500 Torr.

4. The semiconductor processing apparatus of claim 1 wherein the semiconductor processing chamber comprises a high density plasma chamber, the high density plasma chamber comprising:

an adapter located within the high density plasma chamber for supporting and cooling a target during semiconductor wafer processing within the high density plasma chamber;

a cooling system operatively coupled to the adapter for supplying cooling fluid to the adapter; and a shield operatively coupled to the adapter and surrounding the adapter and the semiconductor wafer support; and wherein the bake-out controller is further operatively coupled to the cooling system and is programmed for baking-out the semiconductor processing chamber by:
turning off the supply of cooling fluid to the adapter;
turning on the bake-out mechanism for a first time period sufficient to bake-out the semiconductor processing chamber;
turning off the bake-out mechanism for a second time period sufficient to allow the bake-out to cool; and
turning on the supply of cooling fluid to the adapter during the cooling of the bake-out mechanism.

5. The apparatus of claim 4 wherein the bake-out mechanism comprises at least one bake-out lamp.

6. The apparatus of claim 4 wherein the high density plasma chamber comprises a copper target and a copper wire coil.

* * * * *

UNITED STATES PATENT AND TRADEMARK OFFICE
CERTIFICATE OF CORRECTION

PATENT NO.     : 6,375,743 B2
DATED          : April 23, 2002
INVENTOR(S)    : Arvind Sundarrajan et al.

It is certified that error appears in the above-identified patent and that said Letters Patent is hereby corrected as shown below:

<u>Title page,</u>
Item [75], Inventors, replace "Arvind Sundarrajan, Santa Clara; Dinesh Saigal, San Jose; Peijun Ding, San Jose, all of CA (US)" with -- Arvind Sundarrajan, Santa Clara, Dinesh Saigal; San Jose; Peijun Ding, San Jose; James van Gogh, Sunnyvale, all of CA (US) --.

Signed and Sealed this

Fourth Day of February, 2003

JAMES E. ROGAN
*Director of the United States Patent and Trademark Office*